United States Patent
Marsh (10) Patent No.: US 7,157,783 B2
(45) Date of Patent: Jan. 2, 2007

(54) PLATINUM STUFFED WITH SILICON OXIDE AS A DIFFUSION OXYGEN BARRIER FOR SEMICONDUCTOR DEVICES

(75) Inventor: Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 260 days.

(21) Appl. No.: 10/929,633

(22) Filed: Aug. 30, 2004

(65) Prior Publication Data

US 2005/0082587 A1   Apr. 21, 2005

Related U.S. Application Data

(62) Division of application No. 10/230,605, filed on Aug. 29, 2002, now Pat. No. 6,830,983.

(51) Int. Cl.
   *H01L 29/00* (2006.01)
(52) U.S. Cl. ........................................ 257/532
(58) Field of Classification Search ............. 257/528, 257/532, 535
   See application file for complete search history.

(56) References Cited

U.S. PATENT DOCUMENTS

| | | | |
|---|---|---|---|
| 5,622,893 A * | 4/1997 | Summerfelt et al. ........ | 438/396 |
| 5,990,559 A | 11/1999 | Marsh ......................... | 257/768 |
| 6,175,129 B1 | 1/2001 | Liu et al. ..................... | 257/301 |
| 6,197,628 B1 | 3/2001 | Vaartstra et al. ............. | 438/238 |
| 6,204,172 B1 | 3/2001 | Marsh ......................... | 438/653 |
| 6,271,131 B1 | 8/2001 | Uhlenbrock et al. ........ | 438/681 |
| 6,323,081 B1 | 11/2001 | Marsh ......................... | 438/239 |

* cited by examiner

*Primary Examiner*—Scott B. Geyer
(74) *Attorney, Agent, or Firm*—Schwegman, Lundberg, Woessner & Kluth, P.A.

(57) ABSTRACT

The present invention provides techniques to fabricate high dielectric MIM storage cell capacitors. In one embodiment, this is accomplished by forming a silicon contact is then formed to electrically connect the formed bottom electrode layer in the container with the at least one associated transistor device. A titanium nitride barrier layer is then formed over the silicon contact. An oxygen barrier layer including platinum stuffed with silicon oxide is then formed over the titanium nitride layer and below the bottom electrode layer. A bottom electrode layer is then formed using platinum over interior surfaces of a container formed relative to at lest one associated transistor device on a silicon substrate. Further, a high dielectric insulator layer is formed over the bottom electrode layer. A top electrode layer is then formed over the high dielectric insulator layer.

40 Claims, 6 Drawing Sheets

PLATINUM STUFFED WITH SILICON OXIDE AS A DIFFUSION OXYGEN BARRIER FOR SEMICONDUCTOR DEVICES

This application is a Divisional of U.S. application Ser. No. 10/230,605, filed Aug. 29, 2002 now U.S. Pat. No. 6,830,983 which is incorporated herein by reference.

FIELD OF THE INVENTION

The present invention relates to semiconductor devices and, in particular, to diffusion barrier layers in dense semiconductor memory arrays.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, for example, conductive layers in contact holes, vias, etc. In many applications, it is preferable that the material used provides effective diffusion barrier characteristics.

For example, effective diffusion barrier characteristics are required for conductive materials used in the formation of storage cell capacitors of memory devices, such as DRAMs. As memory devices become denser, it is necessary to decrease the size of circuit components forming such devices. One way to retain storage capacity of storage cell capacitors of memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material. However, generally one or more of the layers of the conductive materials used for the electrodes, particularly the lower electrode of a cell capacitor, must have certain barrier properties and oxidation resistance properties. Such properties are particularly required when high dielectric constant materials are used for the dielectric layer of the storage cell capacitor because of the processes used for forming such high dielectric materials. For example, deposition of high dielectric materials can occur at temperatures greater than 450° C., in an oxygen-containing atmosphere or involves post deposition anneals in excess of 700° C. in an oxidizing atmosphere.

Generally, various metals and metallic compounds, and typically noble metals, such as platinum, have been proposed as the electrodes or at least one of the layers of electrodes for use with high dielectric constant materials as insulators for high dielectric MIM (metal-insulator-metal) storage cell capacitors. However, reliable electrical connections should generally be constructed which do not diminish the beneficial properties of the high dielectric constant materials. For platinum to function well as a bottom electrode, it must be an effective barrier to the diffusion of oxygen and silicon. This is required since any oxidation of the underlying silicon upon which the capacitor is formed will result in decreased series capacitance thus degrading the storage capacity of the cell capacitor. Platinum, used alone as an electrode layer, is too permeable to oxygen to be used as a bottom electrode of a storage cell capacitor.

Various high dielectric materials are used as insulators in MIM capacitors. For example, dielectric materials include tantalum oxide ($Ta_2O_5$), strontium titanate ($SrTiO_3$), alumina ($Al_2O_3$), barium strontium titanate $BaSrTiO_3$ (BST) zirconium oxide ($ZrO_2$), and hafnium oxide ($HfO_2$). Generally, such high dielectric materials are deposited at temperatures higher than 450° C., in an oxygen-containing atmosphere or are annealed in oxygen-containing atmosphere to further oxidize and improve the dielectric properties, such as the dielectric constant and leakage of the dielectric materials. Generally, the dielectric properties of these dielectric materials improve with increased temperatures of deposition and/or anneal. Current barrier materials are only able to provide an effective barrier against diffusion of oxygen into the underlying silicon layer during deposition and oxidation of the high dielectric materials up to a temperature of around 650° C. Since platinum is very permeable to oxygen, without an effective barrier layer between the platinum and the underlying silicon, the oxygen will diffuse through the platinum during oxidation of the dielectric materials at temperatures higher than 450° C.

In addition, in some embodiments, semiconductor structures include a polysilicon contact to provide electrical communication between the substrate and the platinum bottom electrode of the MIM storage cell capacitor. Further in these structures, various barrier layers are formed over the polysilicon contact and below the platinum bottom electrode. For example, such barrier layers may be titanium nitride, tungsten nitride, or any other metal nitride, which acts as a silicon barrier between contact and electrode. In addition, one or more other barrier layers may be included to prevent diffusion of oxygen for example, during deposition of high dielectric materials at high temperatures higher than 500° C. or after anneal, in an oxygen-containing atmosphere. Such barriers can also get oxidized when the temperature during deposition or anneal and oxidation of high dielectric materials is around 650° C. or higher. This can result in degrading the barrier properties. For example, a titanium nitride (TiN) barrier layer may get converted to titanium dioxide ($TiO_2$) and so on.

Thus, there is a need in the art for an effective oxygen barrier layer in semiconductor structures including high dielectric MIM capacitors that can overcome the above-described problems.

SUMMARY OF THE INVENTION

The present invention provides techniques for fabricating an effective oxygen barrier layer in dense semiconductor memory arrays.

In one aspect, the invention provides methods for forming a high dielectric MIM storage cell capacitor on a silicon substrate. In one embodiment of the methods, the high dielectric MIM storage cell capacitor is fabricated by forming a barrier layer, including platinum stuffed with silicon oxide over the silicon substrate. A bottom electrode layer is then formed by using platinum over the formed barrier layer. Further, a tantalum oxide insulator layer is formed over the formed platinum layer. A top electrode layer is then formed over the formed tantalum oxide layer.

In another aspect, the invention provides methods for forming a semiconductor structure including at least one transistor device, on a silicon substrate. In one embodiment of the methods a polysilicon contact is then formed to electrically connect the formed bottom electrode layer in the container with the at least one transistor device. A titanium nitride barrier layer is then formed over the polysilicon contact. An oxygen barrier layer, including platinum stuffed with silicon oxide is then formed over the titanium nitride layer and below the bottom electrode layer. A bottom electrode layer is then formed by using platinum over interior surfaces of a container formed relative to the at least one transistor device in the silicon substrate. Further, a high dielectric insulator layer is formed over the bottom electrode layer. In addition, a top electrode layer is over the formed high dielectric insulator layer.

In another aspect, the invention provides a high dielectric MIM storage cell capacitor. In one embodiment, the high dielectric MIM storage cell capacitor includes an oxygen barrier layer, including platinum stuffed with silicon oxide, overlying a silicon substrate. A bottom platinum electrode layer overlies the oxygen barrier layer. A high dielectric layer overlies the bottom platinum electrode layer. Further, a top electrode overlies the high dielectric layer.

In yet another aspect, the invention provides a semiconductor structure including a high dielectric MIM container capacitor and at least one associated transistor device on a silicon substrate. In one embodiment, the semiconductor structure includes a cup-shaped bottom electrode defining an interior surface and an exterior surface within a container formed in the silicon substrate. A high dielectric layer overlies the interior surface of the bottom electrode. A top electrode overlies the high dielectric layer. A silicon contact electrically connects the bottom electrode with the at least one associated transistor device. The silicon contact includes a titanium nitride layer and a platinum stuffed with silicon oxide barrier layer such that the titanium nitride layer overlies the silicon contact and the platinum stuffed with silicon oxide barrier layer overlies the titanium nitride layer and underlies the bottom electrode.

Additional advantages and features of the present invention will be more apparent from the detailed description and accompanying drawings, which illustrate preferred embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term 'substrate' used in the following description may include materials, such as silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may be utilized to form regions, junctions, or layers in or on the base semiconductor or foundation.

The terms "semiconductive wafer fragment" or "wafer fragment" or "wafer" will be understood to mean any construction comprising semiconductor material, including but not limited to, bulk semiconductive materials such as a semiconductor wafer (either alone or in assemblies comprising other material thereon), and semiconductive material layers (either alone or in assemblies comprising other materials).

The present invention provides techniques for fabricating an effective oxygen barrier layer in dense semiconductor memory cell arrays. In some embodiments, the formed memory cell array can be a flash memory cell array, a memory circuit including an array of memory cells disposed on a substrate and/or a logic circuit including an array of memory cells.

Figure 1:
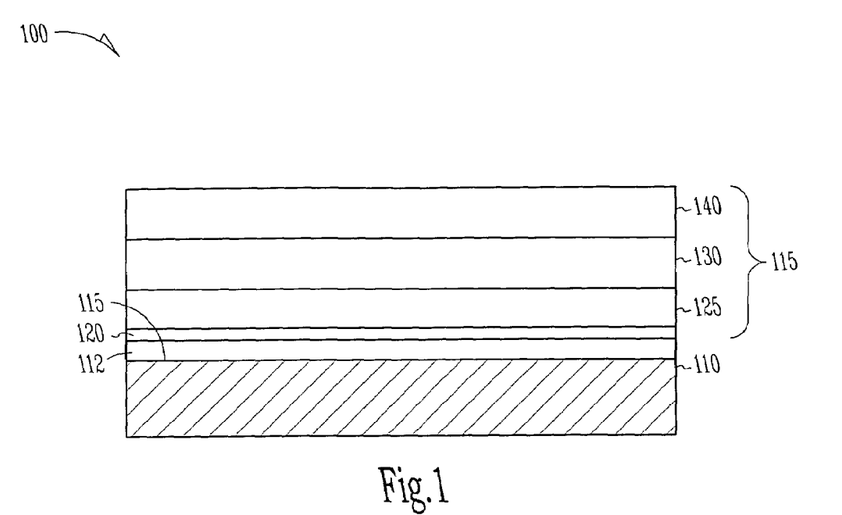
FIG. 1 shows a cross sectional view of a semiconductor structure, including a oxygen barrier layer, in a high dielectric MIM capacitor according to an embodiment of the present invention.

FIG. 1 shows a cross sectional view of a semiconductor structure 100 including an oxygen barrier layer 120 in a high dielectric MIM capacitor 115 disposed on a substrate 110. Capacitor structure 115 includes silicon diffusion barrier layer 112, an oxygen barrier layer 120 overlying the silicon diffusion barrier layer 112, a bottom electrode layer 125 overlying the oxygen barrier layer 120, a top electrode layer 140, and a high dielectric layer 130 interposed between the top and bottom electrode layers 140 and 125, respectively.

In the embodiment shown in FIG. 1, bottom electrode layer 125 is formed using platinum. Top electrode layer 140 may be formed using platinum or any other noble metals, such as rhodium, iridium, or metal nitride (TiN or WN). High dielectric layer 130 is formed using materials having high dielectric constant. With the use of such high dielectric constant materials for high dielectric layer 130, the diffusion barrier properties of bottom platinum electrode layer 125 is particularly important. This is required since any oxidation of the underlying silicon, upon which the capacitor is formed, will result in decreased series capacitance, thus degrading the storage capacity of the cell capacitor. Platinum, used alone as an electrode layer, is too permeable to oxygen to be used as a bottom electrode of a storage cell capacitor.

For example, to function well as a bottom electrode of a capacitor structure, the electrode layer or electrode stack must act as an effective barrier to the diffusion of oxygen, particularly due to the processes used to form the high dielectric constant materials. Such diffusion barrier properties are particularly required when the substrate 110 includes a silicon containing surface 115 upon which the capacitor is formed. For example, the silicon containing surface may be polysilicon, silicon substrate material, N-doped silicon, P-doped silicon, and so on, since oxidation of the diffused silicon may result in degraded capacitance. For example, diffusion of any oxygen through the barrier layer into the silicon may result in degraded capacitance of a memory device.

Various high dielectric materials are currently used as insulators in MIM capacitor structures for high dielectric layer 130. For example, dielectric materials may include tantalum oxide ($Ta_2O_5$), strontium titanate ($SrTiO_3$), alumina ($Al_2O_3$), hafnium oxide ($HfO_2$), titanium oxide ($TiO_2$), zirconium oxide ($ZrO_2$), barium strontium titanate $BaSrTiO_3$ (BST), or metal doped versions of these materials like yttrium doped $Al_2O_3$ or Ti doped $Ta_2O_5$, or laminants of films, such as stacks of $Al_2O_3/Ta_2O_5/Al_2O_3$.

In some embodiments, ferroelectric materials are used as insulators in ferroelectric capacitor for a ferroelectric memory devices. For example, ferroelectric materials may include strontium bismuth niobate $SrBi_2Nb_2O_9$ (SBN), lead-zirconium-titanate (PZT), lanthanum modified lead-zirconium-titanate (PLZT), lead-lanthanum-titanate (PLT), barium strontium titanate $BaSrTiO_3$ (BST) or strontium bismuth tantalate $SrBi_2Ta_2O_9$ (SBT).

Generally, such high dielectric or ferroelectric materials are deposited at temperatures higher than 450° C. and/or annealed at temperatures of about 450° C. to 850° C., in an oxygen-containing atmosphere to further oxidize and improve the electrical properties, such as the dielectric constant of the dielectric materials. Generally, the dielectric properties of these dielectric materials improve with increased temperatures during deposition and/or oxidation of the dielectric materials. Current barrier materials used in MIM capacitors are only able to provide an effective barrier against diffusion of oxygen into the underlying silicon layer during deposition and oxidation of the high dielectric materials up to a temperature of around 500° C. to 700° C. Since platinum is very permeable to oxygen, without an effective barrier layer between the platinum and the underlying silicon, the oxygen will diffuse through the platinum during oxidation of the dielectric materials at temperatures higher than 500° C. to 700° C.

The deposition of oxygen barrier layer 120, including platinum stuffed with silicon oxide enhances the diffusion barrier properties of oxygen barrier layer 120 up to temperatures of 850° C. This provides a significant improvement over current barrier layers. High dielectric layer 130 is formed over the bottom electrode layer 125 using tantalum oxide after anneal at temperatures around 450° C. to 850° C. in an oxygen-containing atmosphere. In these embodiments, the tantalum oxide layer is deposited such that it conforms uniformly over the bottom electrode layer 125 using techniques, such as chemical vapor deposition (CVD), physical vapor deposition (PVD), and/or atomic layer deposition (ALD). The thickness of the tantalum oxide layer can be in the range of about 50 to 150 Å. In some embodiments, when the bottom electrode is made of noble metals, such as rhodium or iridium, the corresponding oxygen barrier layer is formed using rhodium stuffed with silicon oxide or iridium stuffed with silicon oxide, respectively.

In some embodiments, the platinum doped with silicon oxide barrier layer is deposited using ALD. In these embodiments, the platinum doped with silicon oxide barrier layer is deposited using alternating platinum precursors, $O_2$, $Si_xRyHz$, and $O_2$ cycles for a predetermined number of times to obtain a desired thickness of the platinum stuffed with silicon oxide. To provide an effective barrier layer, the desired thickness of the platinum stuffed with silicon oxide layer is around 500 Å. In these embodiments, the platinum stuffed with silicon oxide barrier layer includes alternating layers of about 20 to 55 Å thick platinum and platinum-silicide and about 1 Å thick of $SiO_2$. In some embodiments, platinum precursors can include materials, such as (Trimethyl)methylcyclopentadienyl platinum (Pt10), (Trimethyl) Cyclopentadienyl (CpPtMe3), Pt (acetylacetonate)2, Pt(PF3)4, Pt(CO)2Cl2, cis-[PtMe2(MeNC)2], platinum hexafluorocetylacetonate. In some embodiments, $Si_xRyHz$ includes organic groups, such as $CH_3$, $C_2$, $OC_2H_5$.

In some embodiments, the platinum stuffed with silicon oxide barrier layer is deposited using ALD. The platinum stuffed with silicon oxide barrier layer is obtained by depositing platinum for about 20 to 55 cycles in the ALD using Pt10 dose and followed by purging/evacuating the chamber and further followed by dosing with $O_2$. Then the chamber is purged/evacuated. The platinum film is then dosed with disilane ($Si_2H_6$) and then again followed by purging/evacuating the chamber. Then, dosing again with 2. This alternating ALD treatment yields a $SiO_2$ layer with partially silicided platinum. The $Si_2H_6$ to platinum cycle ratio is low to get a small amount of silicide formation and a low level of $SiO_2$ doping so that the film is still conductive. The formation of $SiO_2$, in combination with partial siliciding the platinum, results in a silicon oxide doped platinum-silicide-platinum metal matrix. The formation of such a platinum-silicide-platinum matrix results in enhanced barrier properties against oxygen diffusion. In some embodiments, silicon diffusion barrier layer 112 is formed using titanium nitride (TiN).

Figure 2:
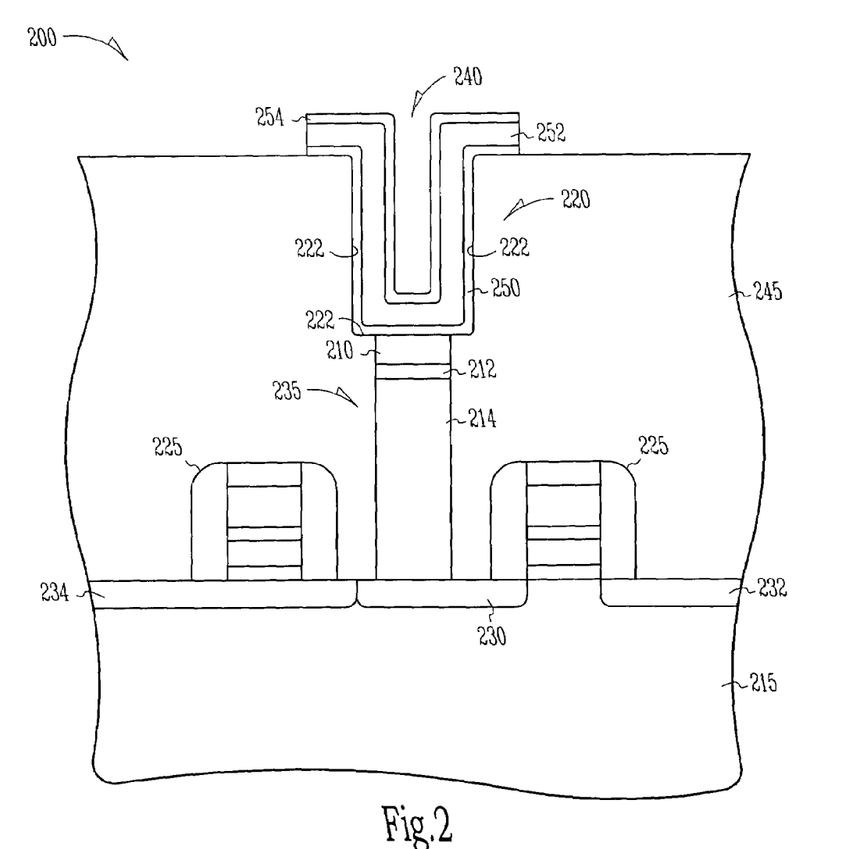
FIG. 2 is a cross sectional view illustrating the use of an oxygen barrier layer in a storage cell capacitor application.

FIG. 2 is a cross sectional view illustrating a portion of semiconductor wafer structure 200 including a platinum stuffed with silicon oxide barrier layer 210 of the present invention. The wafer fragment 200 further includes a semiconductor wafer substrate or the wafer 215 along with various process layers formed thereon, including one or more transistor devices 225 over suitable source and drain regions 230 and 232, respectively, and a silicon contact 235. Silicon contact 235 connects a high dielectric MIM storage cell capacitor 220 to an associated one or more transistor devices 225. In this embodiment, the transistor device 225 refers to an active device, i.e., a field effect transistor (FET). The source and drain regions 230 and 232, respectively, and a field oxide region 234 are formed in accordance with conventional processing techniques known to one skilled in the art.

The semiconductor wafer substrate can include semiconductor-based materials, such as silicon-on insulator (SOI), silicon-on sapphire (SOS), doped and undoped semiconductors, epitaxial layers of silicon supported by a base semiconductor foundation, and/or other semiconductor-based materials. The semiconductor-based materials can also include materials, such as silicon-germanium, germanium, and/or gallium arsenide.

Also shown in FIG. 2, is a container or opening 240 that has been formed by conventional dry etching through an insulative layer 245. Insulative layer 245 can include materials, such as silicon dioxide ($SiO_2$), phosphosilicate glass (PSG), borosilicate glass (BSG), and borophosphosilicate glass (BPSG). Chemicals such as, $CF_4$, $C_4F_6$, and other such chemicals can be used in the conventional dry etch process to form container 240. For simplicity and a better understanding of a memory cell structure, only one container 240 is shown in FIG. 2. It can be envisioned that the substrate can include an array of memory cells including similar containers, silicon contacts, and transistor devices. Container 240 can be a cup shaped container as shown in FIG. 2. The cup shaped structure may have cross-sectional shapes, such as circular, square, rectangular, trapezoidal, triangular, oval, and/or rhomboidal, among other such shapes with respect to the top down view of the cross-sections of the bottom electrodes. Container 240 has a small high aspect opening having feature sizes or critical dimensions below about 1 micron (e.g., such as a diameter or width of an opening being less than about 1 micron) and aspect ratios greater than about 1. Such aspect ratios are applicable to contact holes, vias, trenches, and any other configured openings. The present invention is particularly beneficial for forming oxygen diffusion barrier layers in small high aspect ratio features.

As shown in FIG. 2, a bottom electrode layer 250 is formed on and around interior surfaces 222 of the container 240. In the embodiment shown in FIG. 2, bottom electrode layer 250 is formed using platinum. One or more transistor devices 225 are formed relative to the source region 230, the drain region 232, and the field oxide region 234. Formation of the bottom electrode layer 250 can further include etching or planarizing to remove desired regions.

In this embodiment, silicon contact 235 is formed using a polysilicon contact 214 to provide electrical communication between substrate 215 and high dielectric MIM storage cell capacitor 220. Various barrier layers are formed over polysilicon contact 214 and below bottom electrode layer 250 including a titanium nitride (TiN) layer 212 and a platinum stuffed with silicon oxide layer 210, as shown in FIG. 2. Formation of platinum stuffed with silicon oxide layer 210 is described in more detail with reference to FIG. 1. The TiN barrier layer 212 may be formed by physical vapor deposition (PVD), conventional thermal chemical vapor deposition (TCVD), plasma enhanced CVD (PECVD), or atomic layer deposition (ALD), utilizing a source gas comprising precursors of tetrakisdimethyl-aminotitanium (TDMAT)((($CH_3$)$_2$N)$_4$Ti) and ammonia ($NH_3$), or titanium tetrachloride ($TiCl_4$) and $NH_3$. The thickness of TiN barrier layer 212 can be in the range of about 20 Å to 1000 Å.

As shown in FIG. 2, high dielectric layer 252 is then formed using PVD, TCVD, PECVD, or ALD. High dielectric layer 252 consists of high dielectric materials, such as BST and/or tantalum oxide. Formed high dielectric layer 252 is then annealed in an oxidizing atmosphere at temperatures of up to 850° C. Platinum stuffed with silicon oxide layer 210 formed over the TiN barrier layer 212 provides an effective barrier against diffusion of oxygen during the deposition and oxidation of the tantalum oxide layer 252 up to a temperature of about 850° C. Formation of the tantalum oxide layer is explained in more detail with reference to FIG. 1. Without the platinum stuffed with silicon oxide layer 210, oxygen during the oxygen annealing of tantalum oxide layer 252 at temperatures greater than 450° C. can diffuse through the barrier layer to oxidize the underlying TiN barrier layer 212 to titanium oxide and the polysilicon contact 214 to silicon oxide, resulting in a failure.

A top electrode layer 254 is then formed over tantalum oxide dielectric layer 252. For example, top electrode layer 254 is formed using conductive materials, such as platinum, titanium nitride, ruthenium rhodium, iridium, ruthenium oxide, iridium oxide, and any combination thereof, or any conductive material typically used as an electrode of a storage cell capacitor. In the present invention, top electrode layer 254 is formed using platinum. Top electrode layer 254 can be formed using processes, such as PVD (e.g., sputtering) CVD, or ALD to provide desired resistivity and barrier properties.

It will be recognized by one skilled in the art that any capacitor formed relative to a silicon containing surface, where diffusion barrier properties are required when processing high dielectric layers around and up to a temperature of about 850° C. and/or conformally formed conductive layers are required, will benefit from the present invention. One skilled in the art will also recognize that the bottom electrode layer 250 may include a stack of layers with one or more of the layers being platinum stuffed with silicon oxide deposited as described in the present invention.

Figure 3:
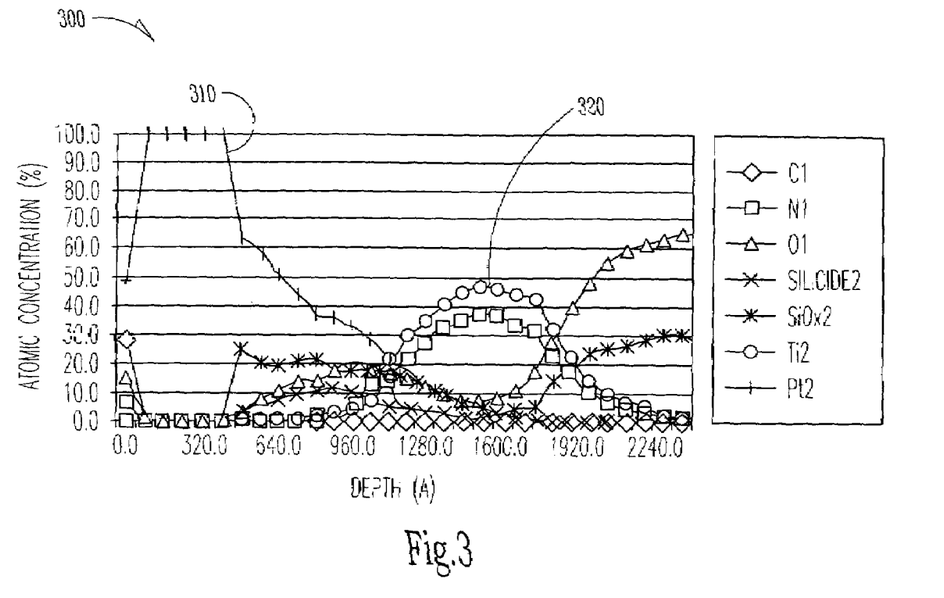
FIG. 3 shows a depth profile of the deposited oxygen barrier layer including platinum stuffed with silicon oxide, before an oxygen anneal of the high dielectric layer.
Figure 4:
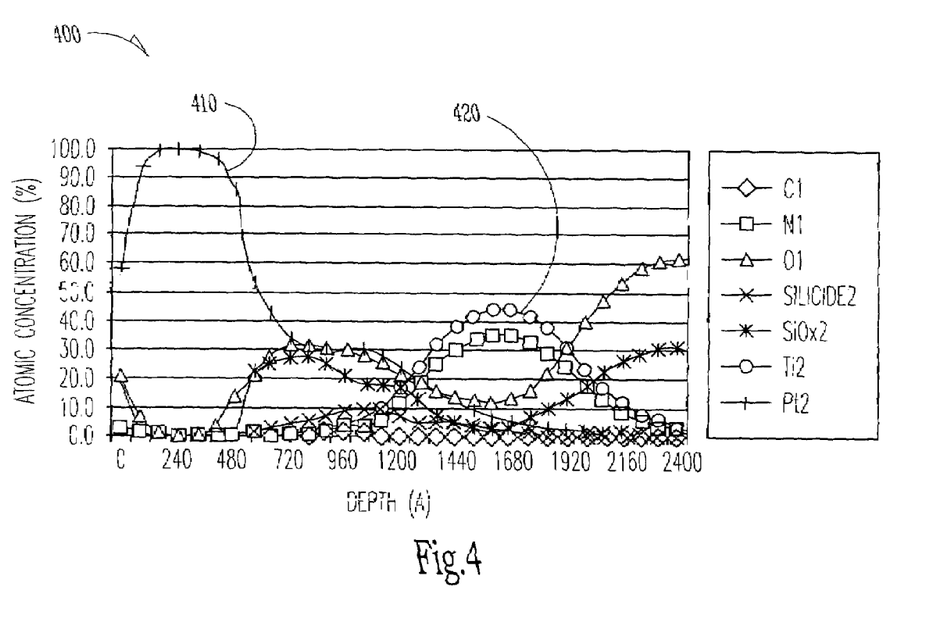
FIG. 4 shows a depth profile of the deposited oxygen barrier layer including platinum stuffed with silicon oxide, after an oxygen anneal of the high dielectric layer.

FIGS. 3 and 4 show depth profiles of a platinum layer on a deposited oxygen barrier layer including platinum stuffed with silicon oxide according to the present invention before and after oxidation of the barrier/electrode stack to a temperature of about 850° C. The depth profiles were attained by using an XPS device available under the trade designation of Phi (Φ) 5600 from Physical Electronics (Eden Prairie, Minn.). The operating conditions for obtaining the profile include x-ray source of 350 W, monochromatic Al $k_\alpha$ (hV=1486.6 eV); 45 degree extraction; 800 μm extraction aperture. Sputtering was performed with a 4 keV argon ion beam restored over a 3 mm area. The sputter time for the depth profile of FIG. 3 is about 19 minutes and the sputter time for the depth profile of FIG. 4 is about 20 minutes.

As shown in FIG. 3, A platinum film of about 500 Å is deposited on platinum stuffed with silicon oxide barrier layer including the silicon oxide doped platinum-silicide-platinum matrix 310 according to the present invention is shown therein including to a depth of about 1000 Å. Further, FIG. 3 shows the deposited TiN layer 320 at a depth of about 1000 Å.

FIG. 4 shows that the deposited platinum layer on silicon oxide doped platinum silicide platinum matrix layer 410 and that the TiN barrier layer 420 underneath the deposited platinum stuffed with silicon oxide layer remain intact as deposited after being subject to a rapid thermal oxygen anneal up to a temperature of about 850° C. for a period of 60 seconds. Without the platinum stuffed with silicon oxide barrier layer 410, the deposited TiN layer 420 below the oxygen barrier layer would be completely turned into titanium oxide. This results in a catastrophic failure because of the loss of contact with the transistor, or the formation of another capacitor in series with the high dielectric capacitor (depends on the configuration of the formed conductive and barrier layers).

Figure 5:
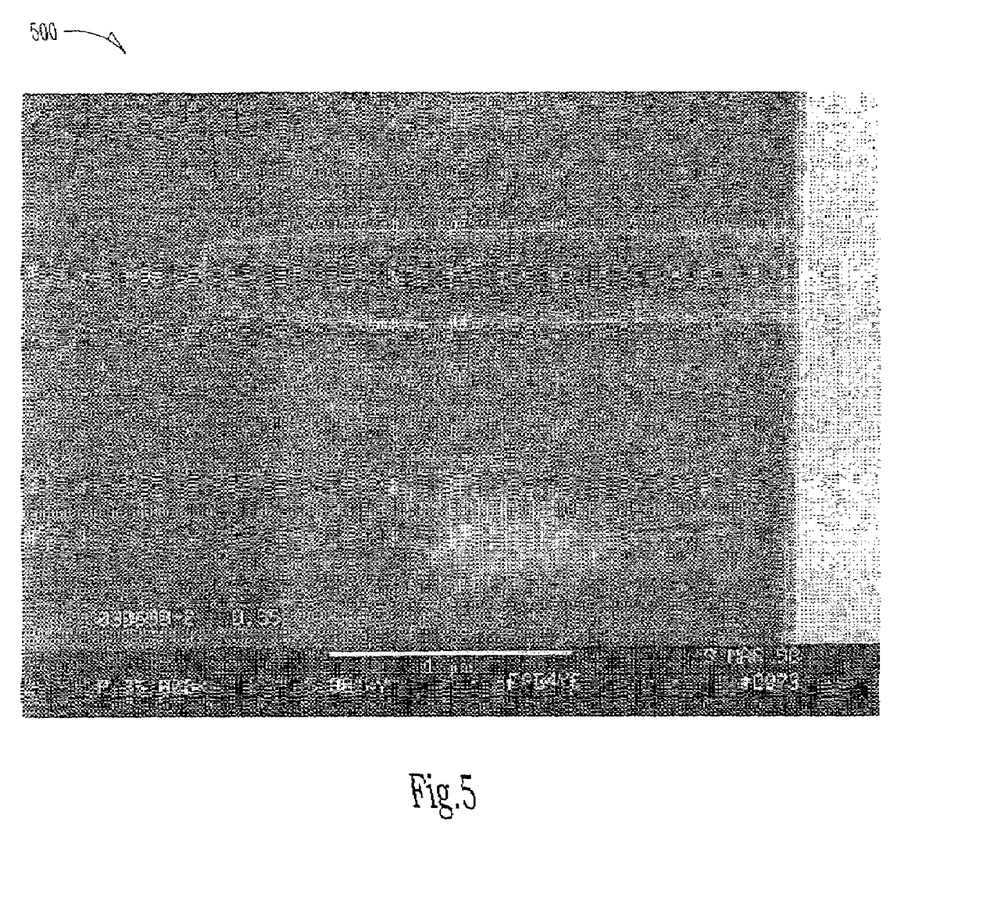
FIG. 5 is a scanning electron microscope (SEM) image of a deposited platinum stuffed with silicon oxide layer on a silicon substrate in a 0.35 diameter test structure.

FIG. 5 is a scanning electron microscope (SEM) image 500 of an ALD deposited platinum stuffed with silicon oxide layer on a silicon substrate in a 0.35 μm diameter contact. The SEM demonstrates the good step coverage and conformality obtained from the ALD deposited platinum stuffed with silicon oxide layer according to the invention. Conformality of the ALD deposited platinum stuffed with silicon oxide layer, as shown in FIG. 5, is about 100% step coverage on a 0.35 μm diameter by 2.4 μm contact. This level of conformity is characteristic of the ALD deposited platinum stuffed with silicon oxide layer of the invention.

Figure 6:
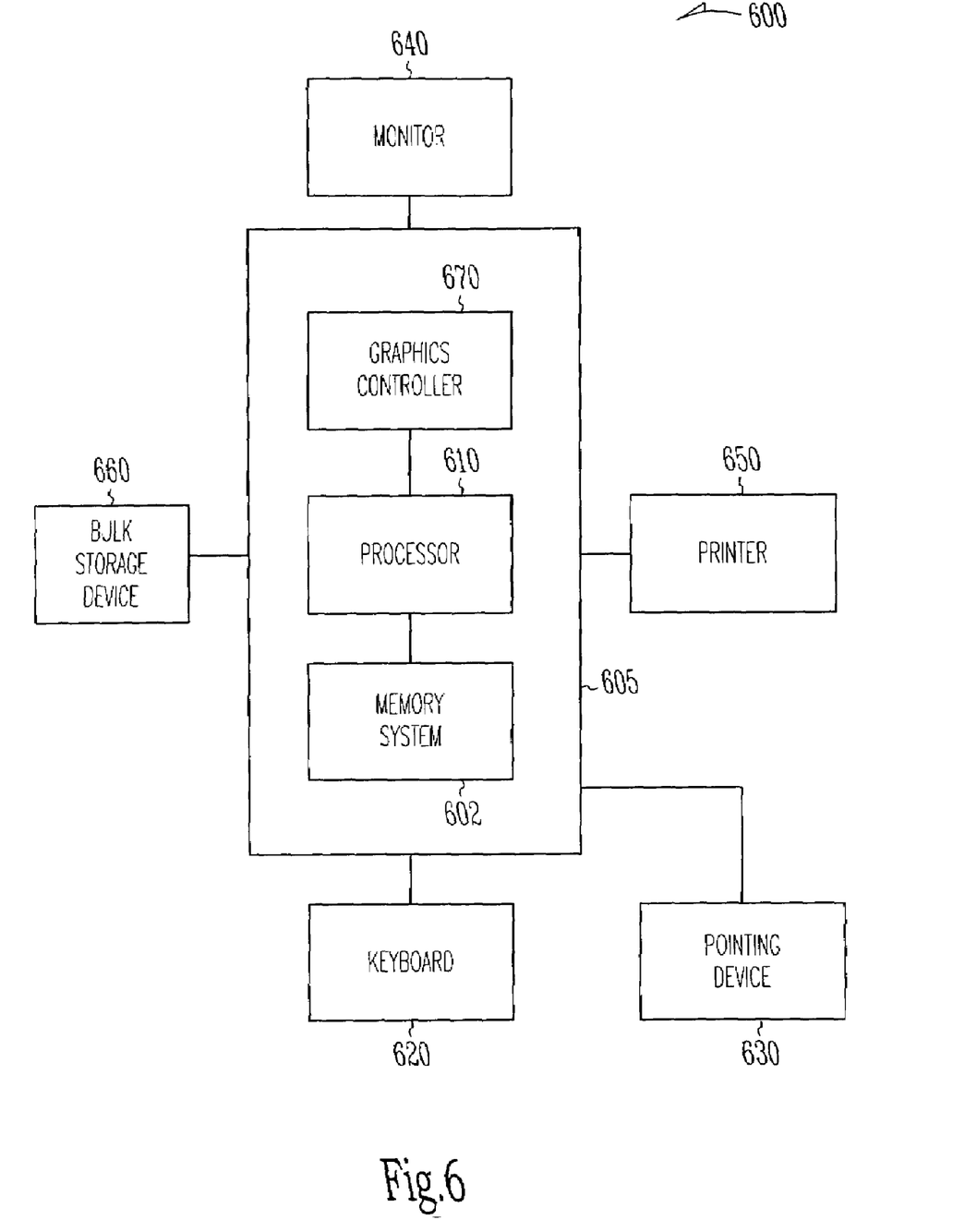
FIG. 6 is a block diagram of an exemplary computer system.

FIG. 6 is a block diagram of a system according to one embodiment of the present invention. Computer system 600 contains a processor 610 and a memory system 602 housed in a computer unit 605. Computer system 600 is but one example of an electronic system containing another electronic system, e.g., memory system 602, as a subcomponent. The memory system 602 includes a memory device that includes a memory cell array as discussed in various embodiments of the present invention. Computer system 600 optionally contains user interface components. These user interface components include a keyboard 620, a pointing device 630, a monitor 640, a printer 650, and a bulk storage device 660. It will be appreciated that other components are often associated with computer system 600 such as modems, device driver cards, additional storage devices, etc. It will further be appreciated that the processor 610 and memory system 602 of computer system 600 can be incorporated on a single integrated circuit. Such single-package processing units reduce the communication time between the processor and the memory circuit. Any of these components of the system may contain a memory device that includes the double-sided HSG electrode of the present invention. This is particularly true of graphics subsystem 670 of FIG. 6 utilizing SGRAM that includes the multiple-mode output driver as discussed in various embodiments of the present invention.

Figure 7:
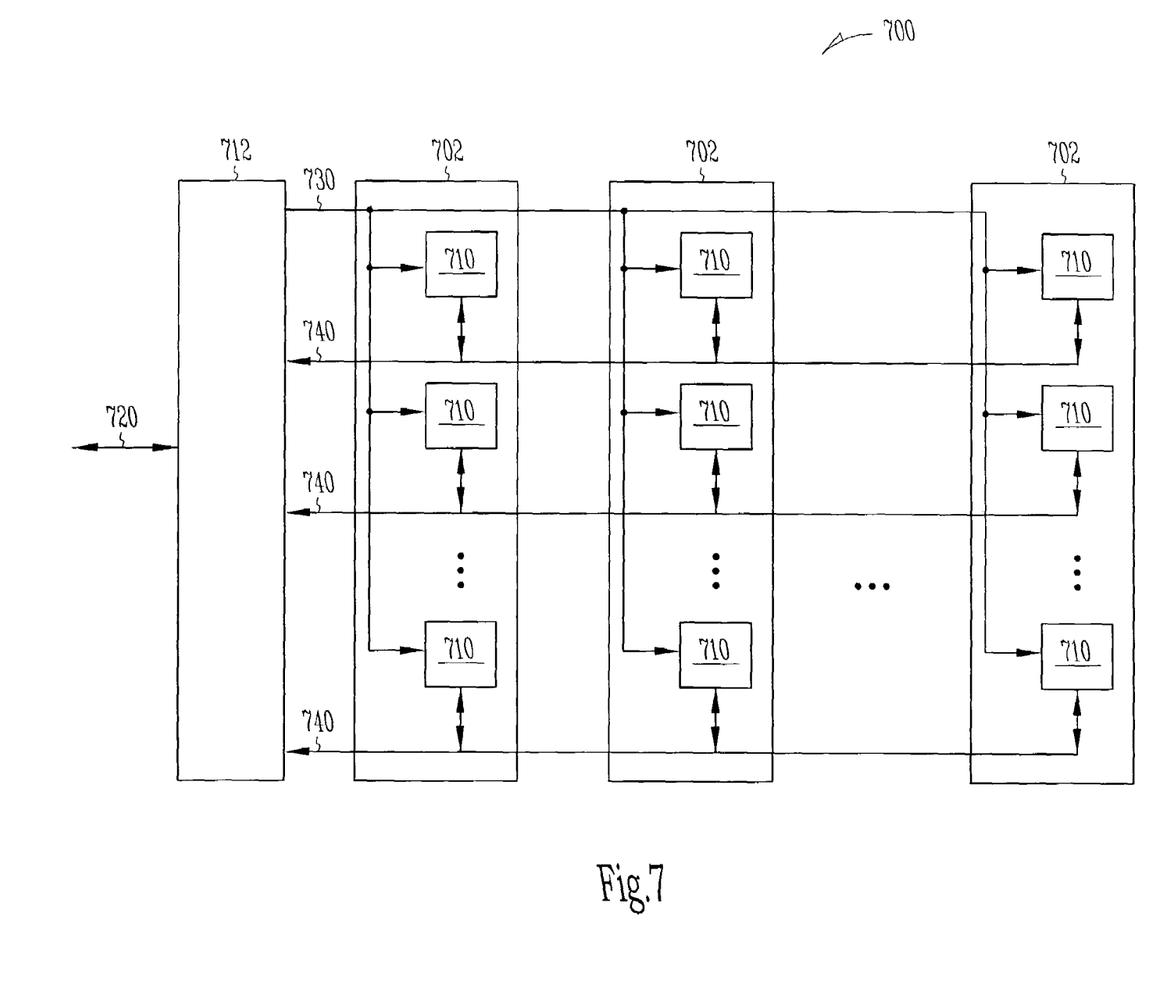
FIG. 7 is a block diagram of an exemplary memory system.

FIG. 7 is a block diagram of a system according to one embodiment of the present invention. Memory system 700 contains one or more memory modules 702 and a memory controller 712. Each memory module 702 includes at least one memory device 710. Memory controller 712 provides and controls a bidirectional interface between memory system 700 and an external system bus 720. Memory system 700 accepts a command signal from the external bus 720 and relays it to the one or more memory modules 702 on a command link 730. Memory system 700 provides for data input and data output between the one or more memory modules 702 and external system bus 720 on data links 740. At least one of the memory devices 710 includes the memory cell array as discussed in various embodiments of the present invention. At least one of the memory devices 710 includes the double-sided HSG electrodes of the present invention.

Figure 8:
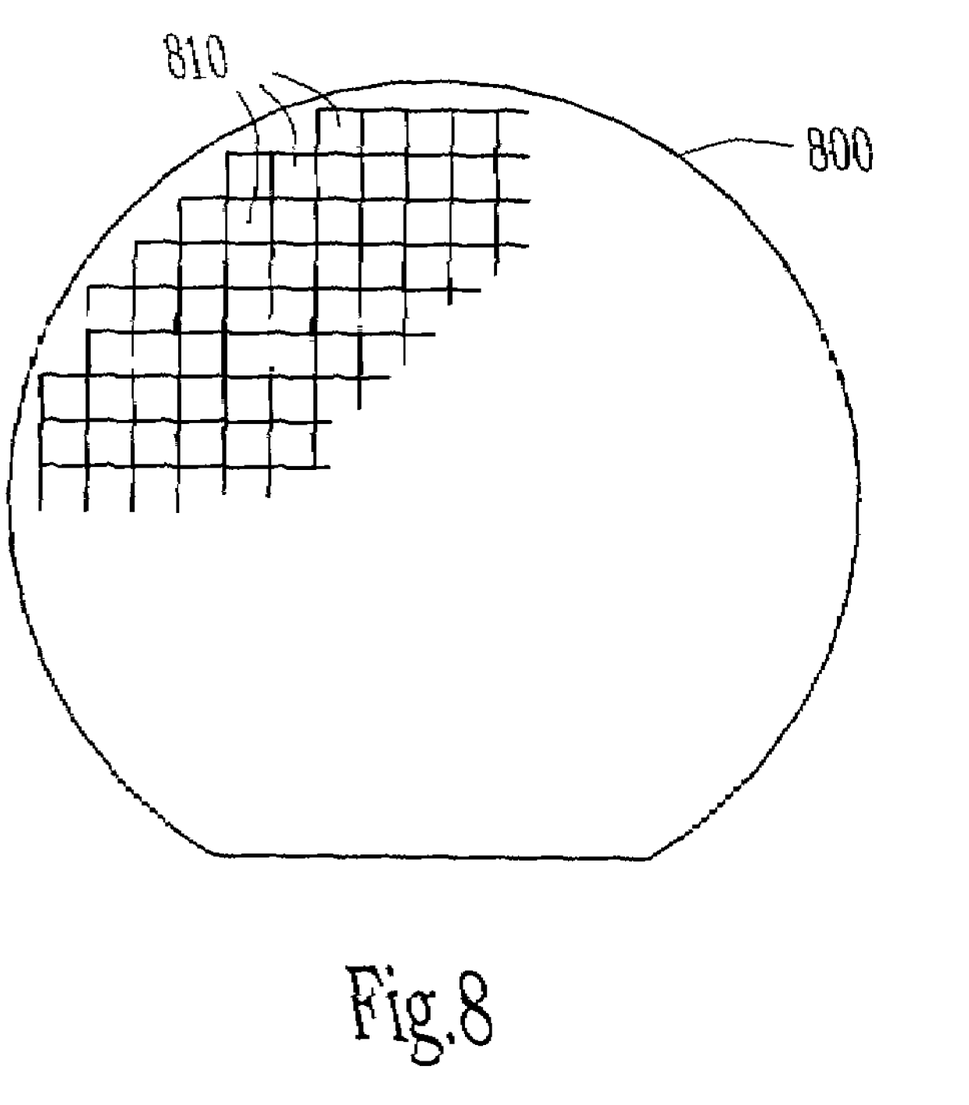
FIG. 8 is an elevation view of a substrate containing semiconductor dies.

With reference to FIG. 8, in one embodiment, a semiconductor die 810 is produced from a silicon wafer 800. A die is an individual pattern, typically rectangular, on a substrate that contains circuitry to perform a specific function. A semiconductor wafer will typically contain a repeated pattern of such dies containing the same functionality. Die 810 may contain circuitry for a memory device, as discussed above. Die 810 may further contain additional circuitry to extend to such complex devices as a monolithic processor with multiple functionality. Die 810 is typically packaged in a protective casing (not shown) with leads extending therefrom (not shown) providing access to the circuitry of the die for unilateral or bilateral communication and control.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A semiconductor structure including a high dielectric MIM container capacitor and at least one associated transistor device, on a silicon substrate, comprising:
   a cup-shaped bottom electrode defining an interior surface and an exterior surface within a container formed on the silicon substrate, wherein the bottom electrode comprises platinum;
   a high dielectric layer overlying the interior surface of the bottom electrode; a top electrode overlying the high dielectric layer; and
   a polysilicon contact electrically connecting the bottom electrode with the silicon substrate, wherein the polysilicon contact includes a titanium nitride barrier layer overlying the polysilicon contact, and platinum stuffed with silicon oxide barrier layer overlying the titanium nitride layer and underlying the bottom electrode.

2. The semiconductor structure of claim 1, wherein forming the high dielectric insulator layer further comprises:
   annealing the formed high dielectric insulator layer to temperatures of about 450° C. to 850° C. in an oxygen-containing atmosphere.

3. The semiconductor structure of claim 1, wherein the oxygen barrier layer is about 50 to 5000 Å thick.

4. The semiconductor structure of claim 1, wherein the TiN barrier layer is about 50 to 1000 Å thick.

5. A semiconductor structure including a high dielectric MIM container capacitor and at least one associated transistor device, on a silicon substrate, comprising:
   a cup-shaped bottom electrode defining an interior surface and an exterior surface within a container formed on the silicon substrate, wherein the bottom electrode comprises rhodium;
   a high dielectric layer overlying the interior surface of the bottom electrode;
   a top electrode overlying the high dielectric layer; and
   a polysilicon contact electrically connecting the bottom electrode with the silicon substrate, wherein the polysilicon contact includes a titanium nitride barrier layer overlying the polysilicon contact, and rhodium stuffed with silicon oxide barrier layer overlying the titanium nitride layer and underlying the bottom electrode.

6. The semiconductor structure of claim 5, wherein the high dielectric layer comprises:
   a tantalum oxide layer formed by annealing the tantalum oxide layer to temperatures in the range of about 450° C. to 850° C. in an oxygen-containing atmosphere.

7. The semiconductor structure of claim 5, wherein the oxygen barrier layer is about 50 to 5000 Å thick.

8. The semiconductor structure of claim 5, wherein the tantalum oxide layer is about 50 to 150 Å thick.

9. A semiconductor structure including a high dielectric MIM container capacitor and at least one associated transistor device, on a silicon substrate, comprising:
   a cup-shaped bottom electrode defining an interior surface and an exterior surface within a container formed on the silicon substrate, wherein the bottom electrode comprises iridium;
   a high dielectric layer overlying the interior surface of the bottom electrode;
   a top electrode overlying the high dielectric layer; and
   a polysilicon contact electrically connecting the bottom electrode with the silicon substrate, wherein the polysilicon contact includes a titanium nitride barrier layer overlying the polysilicon contact, and iridium stuffed with silicon oxide barrier layer overlying the titanium nitride layer and underlying the bottom electrode.

10. The semiconductor structure of claim 9, wherein the high dielectric layer comprises:
a tantalum oxide layer formed by annealing the tantalum oxide layer to temperatures in the range of about 450° C. to 850° C. in an oxygen-containing atmosphere.

11. The semiconductor structure of claim 9, wherein the oxygen barrier layer is about 50 to 5000 Å thick.

12. The semiconductor structure of claim 9, wherein the tantalum oxide layer is about 50 to 150 Å thick.

13. A high dielectric MIM storage cell capacitor, comprising:
a silicon substrate;
an oxygen barrier layer including silicon oxide doped platinum overlying the silicon substrate;
a bottom platinum electrode layer overlying the oxygen barrier layer;
a high dielectric layer overlying the bottom platinum electrode layer; and
a top electrode overlying the high dielectric layer.

14. The capacitor of claim 13, wherein the high dielectric layer comprises a tantalum oxide layer formed by annealing to temperatures in the range of about 450° C. to 850° C. in an oxygen-containing atmosphere.

15. The capacitor of claim 13, wherein the oxygen barrier layer is about 50 to 5000 Å thick.

16. The capacitor of claim 13, wherein the tantalum oxide layer is about 50 to 150 Å thick.

17. A semiconductor structure including a high dielectric MIM container capacitor and at least one associated transistor device, on a silicon substrate, comprising:
a cup-shaped bottom electrode defining an interior surface and an exterior surface within a container formed on the silicon substrate;
a high dielectric layer overlying the interior surface of the bottom electrode;
a top electrode overlying the high dielectric layer; and
a polysilicon contact electrically connecting the bottom electrode with the silicon substrate, wherein the polysilicon contact includes a titanium nitride barrier layer overlying the polysilicon contact, and iridium stuffed with silicon oxide barrier layer overlying the titanium nitride layer and underlying the bottom electrode.

18. The semiconductor structure of claim 17, wherein the high dielectric layer comprises:
a tantalum oxide layer formed by annealing the tantalum oxide layer to temperatures in the range of about 450° C. to 850° C. in an oxygen-containing atmosphere.

19. The semiconductor structure of claim 17, wherein the oxygen barrier layer is about 50 to 5000 Å thick.

20. A semiconductor structure including a high dielectric MIM container capacitor and at least one associated transistor device, on a silicon substrate, comprising:
a cup-shaped bottom electrode defining an interior surface and an exterior surface within a container formed on the silicon substrate, wherein the bottom electrode comprises a noble metal;
a high dielectric layer overlying the interior surface of the bottom electrode;
a top electrode overlying the high dielectric layer; and
a polysilicon contact electrically connecting the bottom electrode with the silicon substrate, wherein the polysilicon contact includes a titanium nitride barrier layer overlying the polysilicon contact, and a noble metal stuffed with silicon oxide barrier layer overlying the titanium nitride layer and underlying the bottom electrode.

21. The semiconductor structure of claim 20, wherein the high dielectric layer comprises:
a tantalum oxide layer formed by annealing the tantalum oxide layer to temperatures in the range of about 450° C. to 850° C. in an oxygen-containing atmosphere.

22. The semiconductor structure of claim 20, wherein the oxygen barrier layer is about 50 to 5000 Å thick.

23. The semiconductor structure of claim 20, wherein the noble metal is selected from the group consisting of platinum, iridium, and rhodium.

24. A semiconductor device, comprising:
a silicon substrate;
an oxygen barrier layer including platinum stuffed with silicon oxide overlying the silicon substrate;
a bottom platinum electrode layer overlying the oxygen barrier layer;
a tantalum oxide dielectric layer overlying the bottom platinum electrode layer; and
a top electrode overlying the tantalum oxide dielectric layer.

25. The semiconductor device of claim 24, wherein the tantalum oxide layer is deposited by annealing the tantalum oxide layer to temperatures in the range of about 450° C. to 850° C. in an oxygen-containing atmosphere.

26. The semiconductor device of claim 24, wherein the oxygen barrier layer is about 50 to 5000 Å thick.

27. A semiconductor structure, comprising:
a plurality of semiconductor devices, wherein each semiconductor device including at least one transistor device, in a silicon substrate comprises:
a cup-shaped bottom electrode defining an interior surface and an exterior surface within a container formed in the silicon substrate, wherein the bottom electrode is made of platinum;
a high dielectric layer overlying the interior surface of the bottom electrode;
a top electrode overlying the high dielectric layer; and
a polysilicon contact electrically connecting the bottom electrode with the at least one transistor device, wherein the polysilicon contact includes a titanium nitride barrier layer and a platinum stuffed with silicon oxide barrier layer overlying the polysilicon contact and underlying the bottom electrode.

28. The semiconductor structure of claim 27, wherein the high dielectric layer comprises materials selected from the group consisting of tantalum oxide ($Ta_2O_5$), strontium titanate ($SrTiO_3$), alumina ($Al_2O_3$), hafnium oxide ($HfO_2$), titanium oxide ($TiO_2$), zirconium oxide ($ZrO_2$), barium strontium titanate $BaSrTiO_3$ (BST).

29. The semiconductor structure of claim 27, wherein the platinum stuffed with silicon oxide barrier layer is about 50 to 5000 Å thick.

30. The semiconductor structure of claim 27, wherein the high dielectric layer is about 50 to 150 Å thick.

31. A logic circuit, comprising:
a plurality of semiconductor devices, wherein each semiconductor device includes at least one transistor device in a silicon substrate, comprising:
a cup-shaped bottom platinum electrode defining an interior surface and an exterior surface within a container formed in the silicon substrate;
a high dielectric layer overlying the interior surface of the bottom electrode;
a top electrode overlying the high dielectric layer; and
a silicon contact, including a titanium nitride barrier layer and a platinum stuffed with silicon oxide barrier layer overlying the silicon contact and underlying the bottom electrode, electrically connects the bottom electrode with the at least one transistor device.

32. The logic circuit of claim 31, wherein the transistor device is disposed over an active region surrounded by an isolation region in the silicon substrate.

33. The logic circuit of claim 31, wherein the transistor device comprises:
   a gate oxide layer over the active region; and
   a gate electrode stack over the gate oxide layer.

34. The logic circuit of claim 31, wherein the platinum stuffed with silicon oxide barrier layer is about 50 to 5000 Å thick.

35. The logic circuit of claim 31, wherein the silicon contact is a polysilicon contact.

36. A semiconductor device, comprising:
   a plurality of high dielectric MIM storage cell capacitors, wherein each capacitor comprises:
   an oxygen barrier layer, including platinum stuffed with silicon oxide overlying a silicon substrate;
   a bottom platinum electrode layer overlying the oxygen barrier layer;
   a tantalum oxide dielectric layer overlying the bottom platinum electrode layer; and
   a top electrode overlying the tantalum oxide dielectric layer.

37. The semiconductor device of claim 36, wherein the top electrode is made from platinum.

38. A semiconductor structure including a high dielectric MIM container capacitor on a silicon substrate, comprising:
   a cup-shaped bottom electrode defining an interior surface and an exterior surface within a container formed on the silicon substrate, wherein the bottom electrode comprises platinum;
   a high dielectric layer overlying the interior surface of the bottom electrode;
   a top electrode overlying the high dielectric layer; and
   a polysilicon contact electrically connecting the bottom electrode with a buried electrical contact on the silicon substrate;
   wherein the polysilicon contact includes a titanium nitride barrier layer overlying the polysilicon contact, and platinum stuffed with silicon oxide barrier layer overlying the titanium nitride layer and underlying the bottom electrode.

39. The semiconductor structure of claim 38, wherein forming the high dielectric insulator layer further comprises:
   annealing the formed high dielectric insulator layer to temperatures of about 450° C. to 850° C. in an oxygen-containing atmosphere.

40. The semiconductor structure of claim 38, wherein the oxygen barrier layer is about 50 to 5000 Å thick.

* * * * *

UNITED STATES PATENT AND TRADEMARK OFFICE
CERTIFICATE OF CORRECTION

PATENT NO. : 7,157,783 B2 Page 1 of 1
APPLICATION NO. : 10/929633
DATED : January 2, 2007
INVENTOR(S) : Marsh It is certified that error appears in the above-identified patent and that said Letters Patent is hereby corrected as shown below:

Column 5, line 25, delete "yittrium" and insert -- yttrium --, therefor.

Column 6, line 20, delete "hexafluorocetylacetonate." and insert -- hexafluoroacetylacetonate. --, therefor.

Column 6, line 30, delete "2." and insert -- $O_2$. --, therefor.

Signed and Sealed this

Thirteenth Day of March, 2007

JON W. DUDAS
*Director of the United States Patent and Trademark Office*